United States Patent
Yu et al.

(10) Patent No.: US 9,418,953 B2
(45) Date of Patent: Aug. 16, 2016

(54) PACKAGING THROUGH PRE-FORMED METAL PINS

(71) Applicant: Taiwan Semiconductor Manufacturing Company, Ltd., Hsin-Chu (TW)

(72) Inventors: Chen-Hua Yu, Hsin-Chu (TW); Chien Ling Hwang, Hsin Chu (TW); Yeong-Jyh Lin, Caotun Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 20 days.

(21) Appl. No.: 14/153,691

(22) Filed: Jan. 13, 2014

(65) Prior Publication Data

US 2015/0200171 A1    Jul. 16, 2015

(51) Int. Cl.
   *H01L 23/00*    (2006.01)

(52) U.S. Cl.
   CPC ............... *H01L 24/08* (2013.01); *H01L 24/09* (2013.01); *H01L 24/83* (2013.01); *H01L 2224/0401* (2013.01); *H01L 2224/08123* (2013.01); *H01L 2224/08148* (2013.01); *H01L 2224/0951* (2013.01); *H01L 2224/8122* (2013.01); *H01L 2924/181* (2013.01)

(58) Field of Classification Search
   CPC ............... H01L 21/449; H01L 21/4846; H01L 21/4885
   USPC .................................................... 438/106–127
   See application file for complete search history.

(56) References Cited

U.S. PATENT DOCUMENTS 5,637,535 A  *  6/1997  Matsuda et al. .............. 438/106
6,080,936 A  *  6/2000  Yamasaki et al. ............. 174/263

\* cited by examiner

*Primary Examiner* — Cuong Q Nguyen
(74) *Attorney, Agent, or Firm* — Slater Matsil, LLP

(57) ABSTRACT

A package includes first package component and a second package component. The first package component includes a first electrical connector at a surface of the first package component, and a first solder region on a surface of the first electrical connector. The second package component includes a second electrical connector at a surface of the second package component, and a second solder region on a surface of the second electrical connector. A metal pin has a first end bonded to the first solder region, and a second end bonded to the second solder region.

20 Claims, 9 Drawing Sheets

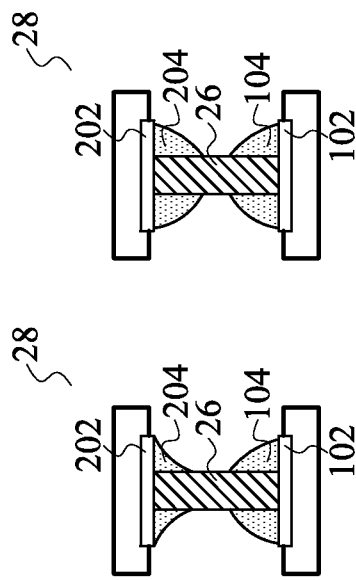
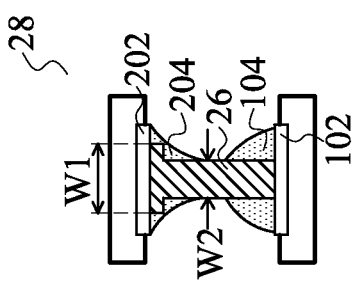
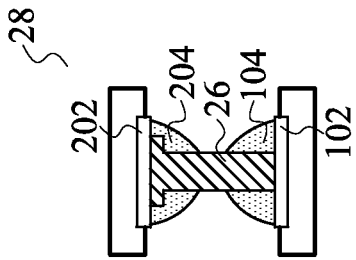
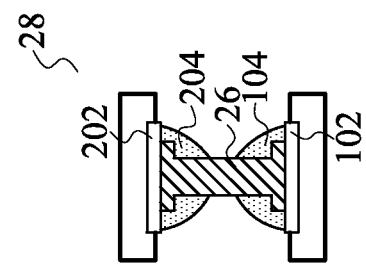
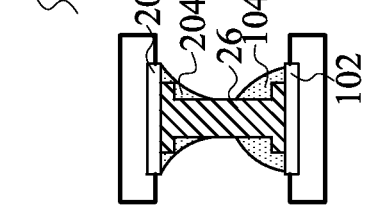
Fig. 2A Fig. 2B Fig. 2C Fig. 2D Fig. 2E Fig. 2F

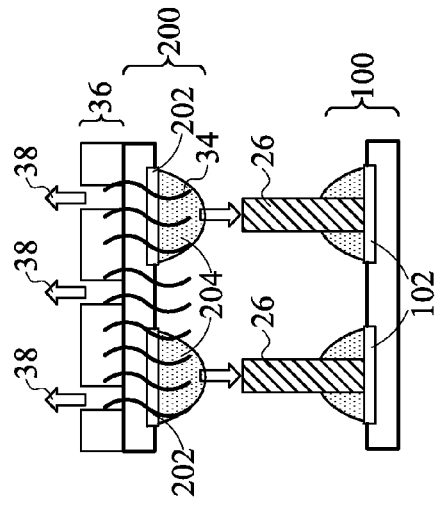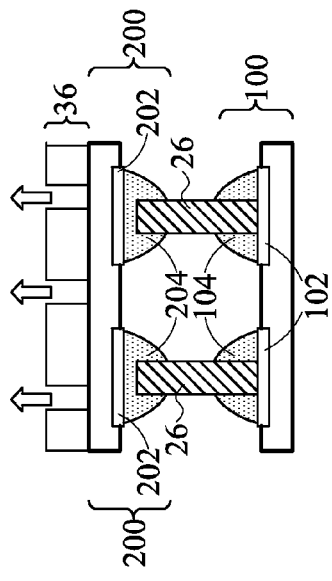
Fig. 5A
Fig. 5B
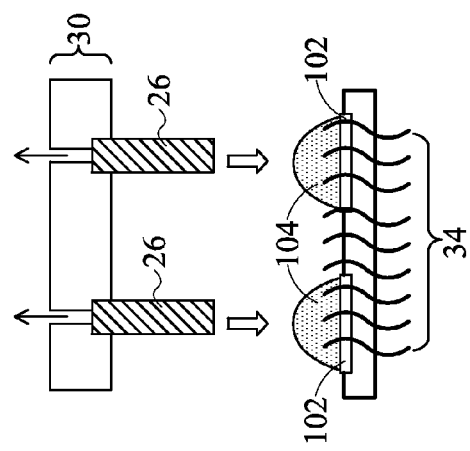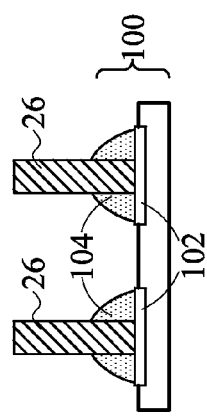
Fig. 4A
Fig. 4B

PACKAGING THROUGH PRE-FORMED METAL PINS

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

The increase in the density of the I/O pads results in the reduction in the pitch of the IO pads. As a result, the closely located solder regions that are used for bonding processes are more likely to bridge.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A through 2J are cross-sectional views of various bond structures in accordance with some exemplary embodiments;

FIGS. 3A through 4B illustrate the cross-sectional views of intermediate stages in the bonding of metal pins to a first package component in accordance with various exemplary embodiments;

FIGS. 5A through 8B illustrate the cross-sectional views of intermediate stages in the bonding of a first package component, on which the metal pins are attached, to a second package component in accordance with various exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package including a metal pin comprising bond structures and the method of forming the same are provided in accordance with various exemplary embodiments. The intermediate stages of forming the bond structures and the packages are illustrated. The variations of the embodiments are discussed. Throughout the various views and illustrative embodiments, like reference numbers are used to designate like elements.

Figure 1:
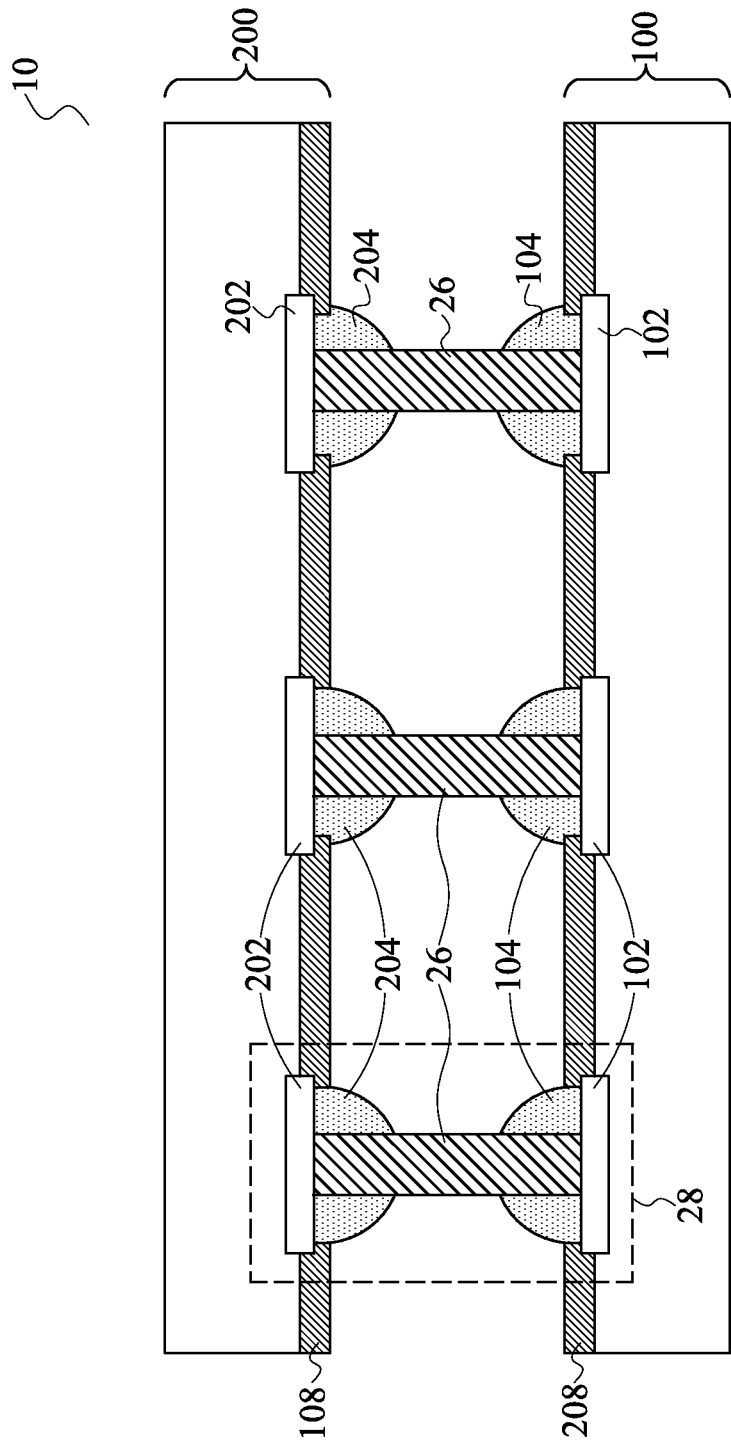
FIG. 1 illustrates a cross-sectional view of a package, in which two package components are bonded through metal pins in accordance with some exemplary embodiments.

FIG. 1 illustrates a cross-sectional view of package 10. Package 10 includes package component 100 and package component 200 bonded together. Each of package components 100 and 200 may be a device die, a package substrate, an interposer, a package, a Printed Circuit Board (PCB), or the like. When being device die, the respective package components 100 or 200 includes active devices (not shown) such as transistors, and/or passive devices such as resistors, capacitors, or the like. When being a package substrate, the respective package component 100 or 200 may be a laminate package substrate, which includes redistribution lines (not shown) built in laminated dielectric layers. The package substrate may also be a build-up substrate, which is formed starting from a core, wherein the redistribution lines formed on the opposite sides of the core are interconnected through metal connections in the core. When being an interposer, the respective package component 100 or 200 includes through-substrate vias (not shown) formed in a substrate, which may be a semiconductor substrate, a dielectric substrate, or the like. The interposer may be free from active devices therein, and may, or may not, include passive devices therein.

Package component 100 includes electrical connectors 102 at its surface. Electrical connectors 102 are connected to the features inside package component 100, which features may include active devices, metal lines, vias, metal pads (not shown), and the like. Package component 200 includes electrical connectors 202 at its surface. Electrical connectors 202 are connected to the features inside package component 200, which features may include active devices, metal lines, vias, metal pads (not shown), and the like. In some embodiments, electrical connectors 102 and/or 202 are metal pads, which include copper pads, aluminum copper pads, or the like. Electrical connectors 102 and/or 202 may also include metal layers such as nickel layers, palladium layers, gold layers, or the like. In some embodiments, surface dielectric layer 108 is formed at the top surface of package component 100, wherein electrical connectors 102 may be metal pads recessed from the top surface of dielectric layer 108. Alternatively, electrical connectors 102 include metal pillars protruding above the top surface of dielectric layer 108. Similarly, surface dielectric layer 208 is formed at the top surface of package component 200, wherein electrical connectors 202 may be metal pads recessed from the illustrated bottom surface of dielectric layer 208. Alternatively, electrical connectors 202 include metal pillars protruding beyond the bottom surface of dielectric layer 208.

Electrical connectors 102 are electrically connected to electrical connectors 202 through metal pins 26. The bonding/connecting of metal pins 26 to electrical connectors 102 is through solder regions 104, which electrically connect metal pins 26 to electrical connectors 102, and physically secure metal pins 26 on electrical connectors 102. The bonding/connecting of metal pins 26 to electrical connectors 202 is through solder regions 204, which electrically connect metal pins 26 to electrical connectors 202, and physically secure metal pins 26 on electrical connectors 202. In some embodiments, a middle portion of one or more of metal pins 26 has no solder regions attached thereon, wherein solder region 104 is spaced apart from the respective overlying solder region 204.

FIGS. 2A through 2J illustrate various bond structures 28 (FIG. 1) that can be adopted by package 10 (FIG. 1) in accordance with various embodiments. In FIGS. 2A through 2J, metal pins 26 are electrically connected to the respective electrical connectors 102 and 202. In some embodiments, metal pins 26 are non-solder pins that do not melt in the typical melting temperature (such as about 200° C. to about 280° C.) of solders. Metal pins 26 may be copper pins, gold pins, aluminum pins, or the like, and may, or may not, include a coating such as a nickel layer. Metal pins 26 may be in physical contact with electrical connectors 102 and 202, or may be spaced apart from electrical connectors 102 and/or 202 by solder regions 104 and 204, respectively. The top-view shape of metal pins 26 in FIGS. 2A through 2J may be a round shape, a hexagon shape, an octagon shape, a square shape, or another polygon shape.

Referring to FIG. 2A, metal pin 26 is in physical contact with both electrical connectors 102 and 202. Solder region 104 has a surface curving outwardly. Conversely, solder region 204 has a surface curving inwardly. FIG. 2B illustrates the bond structure similar to what is shown in FIG. 2A, except that both solder regions 104 and 204 have surfaces curving outwardly. Metal pins 26 may have a uniform thickness and a uniform cross-sectional shape in different parts of metal pins 26. For example, if cross-sectional views are taken at the top end, the bottom end, and the middle (and any other part) of a same metal pin 26 in FIGS. 2A and 2B, then the cross-sectional views are identical.

In FIG. 2C, the cross-sectional view of metal pin 26 is T-shape, and includes a wide portion having lateral dimension W1 and a narrow portion having lateral dimension W2, wherein lateral dimensions W1 and W2 may be diameters, for example. Ratio W1/W2 may be in the range between about 1.2 and about 5 in some embodiments. FIG. 2C illustrates that the surface of solder region 104 curves outwardly, while the surface of solder region 204 curves inwardly. FIG. 2D illustrates a bond structure similar to what is shown in FIG. 2C, except that both solder regions 104 and 204 have surfaces curing outwardly. In FIG. 2C, the cross-sectional view of metal pin 26 has a T-shape. FIGS. 2E and 2F illustrate the embodiments similar to the embodiments shown in FIGS. 2C and 2D, respectively, except that the metal pins 26 in FIGS. 2E and 2F have I-shapes, with wide portions at opposite ends, and a narrow portion between the wide portions. In these embodiments, the narrow portion of a metal pin 26 may have a uniform lateral dimension and a uniform top-view shape.

Figure 2G:
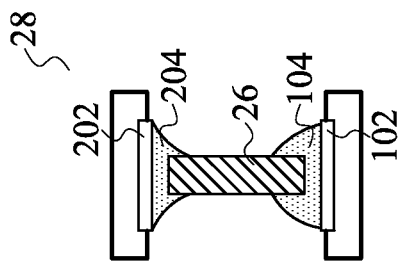
Figure 2I:
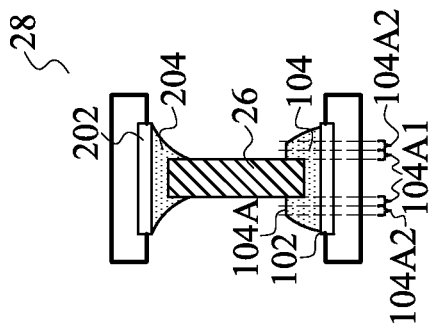
Figure 2H:
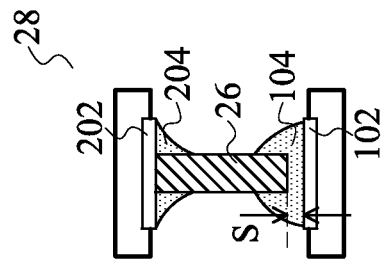

FIGS. 2G and 2H illustrate the embodiments in which metal pins 26 are not in physical contact with electrical connectors 102 and/or 202. Referring to FIG. 2G, metal pin 26 is spaced apart from electrical connector 102. The electrical connection between metal pin 26 and electrical connector 102 is through solder region 104. Spacing S between metal pin 26 and electrical connector 102 may be in the range between about 3 µm and about 30 µm as an example. In FIG. 2H, metal pin 26 is spaced apart from both electrical connectors 102 and 202.

Figure 2J:
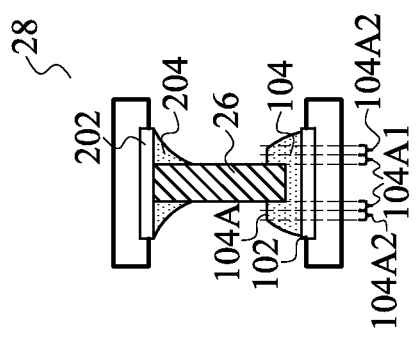

FIGS. 2I and 2J illustrate the embodiments in which solder regions 104 have top surfaces 104A, wherein at least some outer parts 104A2 of top surface 104A are flat, which outer flat parts of top surface 104A may form a ring encircling an inner part/ring 104A1, which may not be flat. In some embodiments, the illustrated bottom surfaces of solder regions 204 may also have flat portions.

It is appreciated that the various features shown in FIGS. 1A through 2J, including, and not limited to, inwardly curved solder surfaces, outwardly curved solder surfaces, uniform metal pins, T-shaped metal pins, I-shaped metal pins, solder with flat top surfaces, and the like, may be mixed to form other bond structures in accordance with alternative embodiments.

Figure 3A:
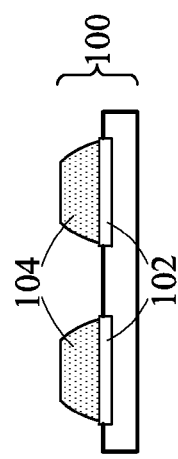
Figure 3B:
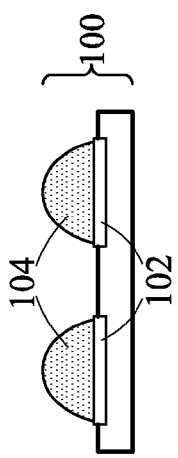

FIGS. 3A through 3E illustrate the cross-sectional views of intermediate stages in the bonding of the ends of metal pins 26 to electrical connectors 102, with the opposite ends of metal pins 26 not bonded. Referring to FIGS. 3A and 3B, package component 100 is provided, which includes electrical connectors 102 and solder regions 104 on electrical connectors 102. In some embodiments as shown in FIG. 3A, solder regions 104 have flat top surfaces, which are formed by coining (pressing with a hard and flat surface) preformed solder regions 104, which pre-formed solder regions may have the shape as shown in FIG. 3B. In alternative embodiments, as shown in FIG. 3B, the surfaces of solder regions 104 are curved.

Figure 3C:
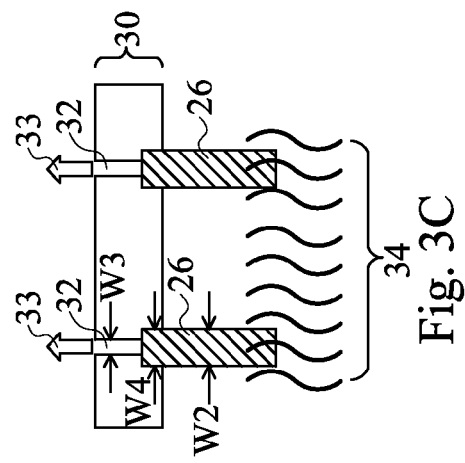

Referring to FIG. 3C, metal pins 26 are picked up by vacuum head 30, which is configured to pick up metal pins 26 through the force resulted from vacuuming. For example, air vacuuming channels 32 are formed in vacuum head 30, with the air being pumped out in the direction marked as 33. The vacuuming channels 32 include narrow portions having lateral dimension W3, and wide portions having lateral dimension W4. Lateral dimension W4 is slightly greater than lateral dimension W2 of metal pins 26, so that metal pins 26 can be inserted into the wide portions of vacuuming channels 32. Lateral dimension W3 is smaller than lateral dimension W2 so that metal pins 26 are stopped. Metal pins 26 are heated to a temperature higher than the melting temperature of solder regions 104 (FIG. 3A or 3B). Throughout the description, curved lines 34 represent the heating. For example, the heating of metal pins 26 may be through heating vacuum head 30 to conduct the heat to metal pins 26. Alternatively, metal pins 26 are heated through an external heat source (not show), wherein vacuum head 30 is not heated. In some embodiments, metal pins 26 are heated to about 180° C. and about 280° C.

Figure 3E:
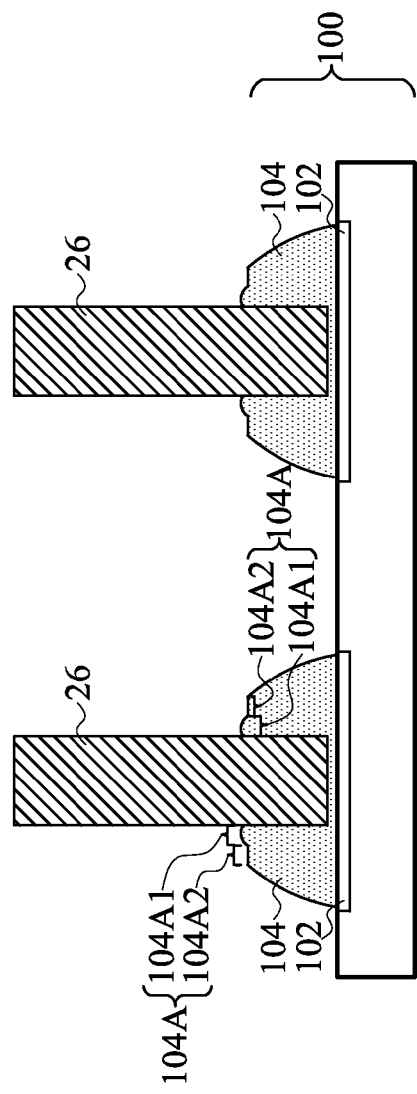
Figure 3D:
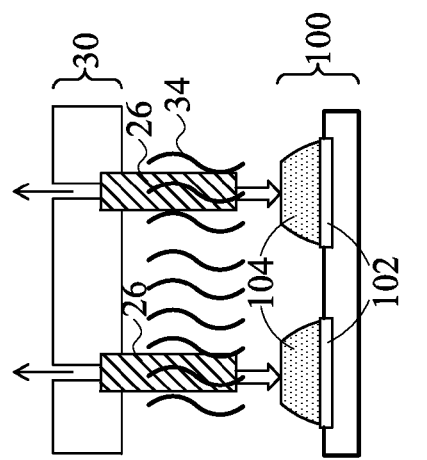

Referring to FIG. 3D, the heated metal pins 26 are inserted into solder regions 104, which are not molten at the time of insertion. Solder regions 104 may not be heated, or may be heated to a temperature lower than the melting temperature of solder regions 104, for example, between about 100° C. and about 200° C. The heated metal pins 26 cause local melting of the portions of solder regions 104 that are in contact with metal pins 26 and the close-by regions, for example, within about 50 µm away from metal pins 26. The portions of solder regions 104 that are farther away from metal pins 26 are not molten. By making solder regions 104 to have the flat top surfaces as shown in FIG. 3A, metal pins 26 may contact the flat surfaces of solder regions 104, and hence metal pins 26 are less likely to bend. As a comparison, if metal pins 26 are in contact with the slant top surfaces of solder regions 104, since the surface tension caused by the molten slanted top surfaces of solder regions 104 are not in horizontal directions, metal pins 26, which are very thin, may be bent. Next, solder regions 104 are cooled down and solidified, and hence metal pins 26 are bonded to electrical connectors 102. The resulting structure is shown in FIG. 3E. In these embodiments, when solder regions 104 are coined (FIG. 3A), in the resulting bond structure, the outer portions 104A2 of solder region 104 that are not molten during the bonding of metal pins 26 will remain flat. While inner portions 104A1 (the molten portion) may have curved surfaces. The flat outer portion 104A2 forms a ring encircling the inner portion 102A1, which also forms a ring.

FIGS. 4A and 4B illustrate the cross-sectional views of the intermediate stages in the bonding of one end of each of metal pins 26 to one of electrical connectors 102 in accordance with alternative embodiments. Referring to FIG. 4A, in these embodiments, rather than heating metal pins 26, solder regions 104 are molten, with metal pins 26 inserted into the molten solder regions 104. Solder regions 104 are then cooled down, and metal pins 26 are bonded to electrical connectors 102. The resulting bond structure is shown in FIG. 4B. In the resulting bond structure, solder regions 104 have curved top surfaces.

After the bonding of metal pins 26 to package component 100, package component 100 is bonded to package component 200. The corresponding bonding processes are shown in FIGS. 5A-5B, 6A-6B, 7A-7B, and 8A-8B in accordance with various embodiments. The processes in 5A-5B, 6A-6B, 7A-7B, and 8A-8B may adopt differential heating, wherein one of (but not both) metal pins 26 (and possibly package component 100) and package component 200 is heated, although both may be heated at the same time in alternative embodiments.

Referring to FIG. 5A, package component 200 is picked up by vacuum head 36, which includes vacuum channels 38, from which air is pumped out. Package component 200 is heated, and solder regions 204 are molten, wherein the heating is represented by curved lines 34. Next, as shown in FIG. 5B, package components 100 and 200 are placed together, with metal pins 26 inserted into molten solder regions 204. After solder regions 204 are cooled down and solidified, packages 100 and 200 are bonded together, and the resulting structure is shown in FIG. 5B.

Figure 6A:
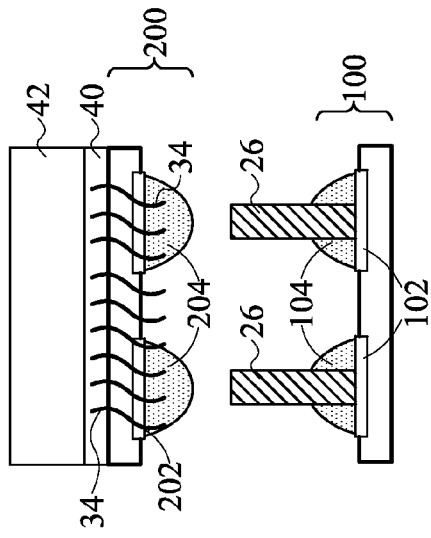
Figure 6B:
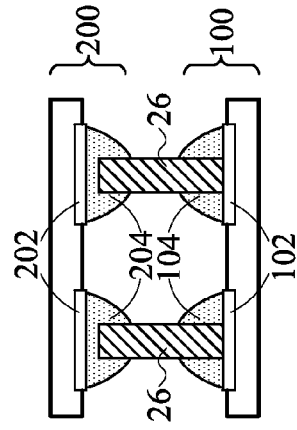

FIGS. 6A and 6B illustrate an alternative embodiment. Referring to FIG. 6A, package component 100, to which metal pins 26 are attached, is picked up by vacuum head 36. Package component 200 is heated, and solder regions 204 are molten. FIG. 6B illustrates the insertion of metal pins 26 into the molten solder regions 204. After solder regions 204 are cooled down and solidified, packages 100 and 200 are bonded together, and the resulting structure is shown in FIG. 6B.

Figure 7A:
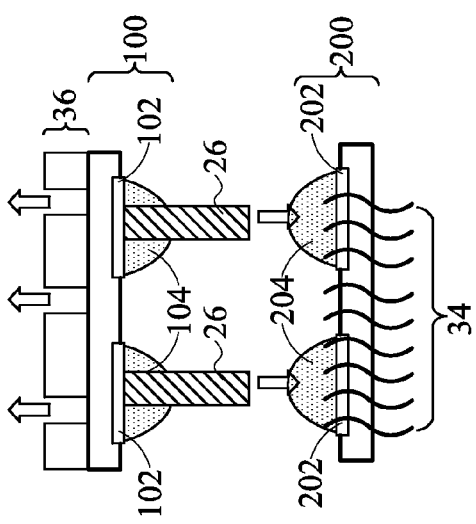
Figure 7B:
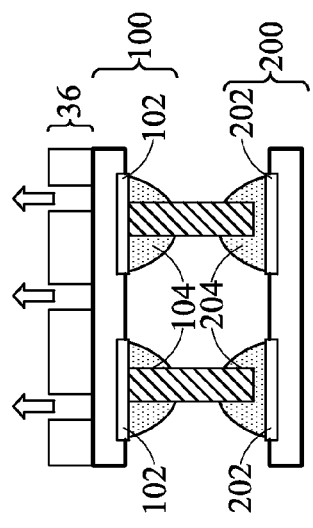

FIGS. 7A and 7B illustrate another alternative embodiment. Referring to FIG. 7A, package component 200, to which metal pins 26 are attached, is attached to carrier 42 through adhesive 40. Carrier 42 may be a glass carrier, a ceramic carrier, or the like. Solder regions 204 are heated and molten, wherein the heating is represented by curved lines 34. Next, as shown in FIG. 7B, package components 100 and 200 are placed together, with metal pins 26 inserted into molten solder regions 204. The carrier 42 and adhesive 40 as shown in FIG. 7A are then removed, and the resulting structure is shown in FIG. 7B.

Figure 8A:
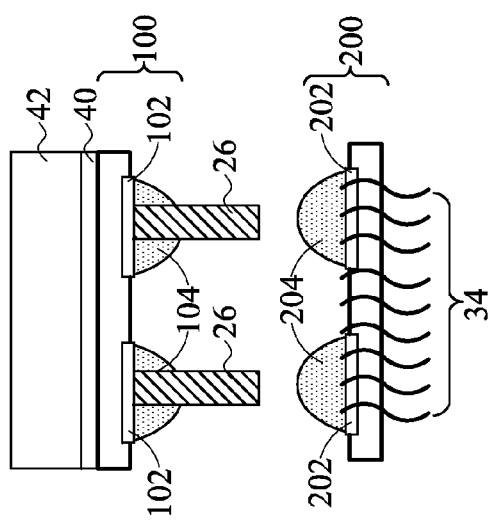
Figure 8B:
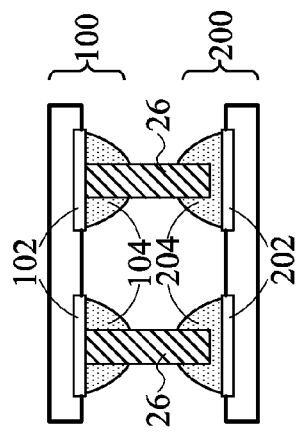

FIGS. 8A and 8B illustrate a yet alternative embodiment. Referring to FIG. 8A, package component 200, to which metal pins 26 are attached, is attached to carrier 42 through adhesive 40. Carrier 42 may be a glass carrier, a ceramic carrier, or the like. Solder regions 204 are heated and molten. FIG. 8B illustrates the insertion of metal pins 26 into solder regions 204. After solder regions 204 are cooled and solidified, packages 100 and 200 are bonded together. The carrier 42 and adhesive 40 as shown in FIG. 8A are then removed, and the resulting structure is shown in FIG. 8B.

Figure 9A:
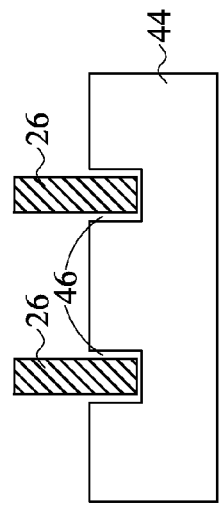
FIGS. 9A through 9E are cross-sectional views of intermediate stages in the manufacturing of a package in accordance with some exemplary embodiments, wherein metal pins are bonded to a first and a second package component simultaneously.

FIGS. 9A through 9E illustrate the cross-sectional views of intermediate stages in the bonding of package components 100 and 200 through metal pins 26 in accordance with alternative embodiments. In these embodiments, metal pins 26 are bonded to package components 100 and 200 simultaneously. Referring to FIG. 9A, mold 44 is provided. Mold 44 may be a metal mold, a ceramic mold, a graphite mold, or an organic mold. Holes 46 are formed in mold 44, and extend from a planar top surface of mold 44 to an intermediate level of mold 44. The depths of holes 46 are smaller than the lengths of metal pins 26. The relative positions of holes 46 are designed to match the relative positions of metal pins 26 in FIG. 9D. The lateral sizes and shapes of holes 46 are designed to hold metal pins 26 therein with a reasonable margin.

A plurality of metal pins 26, which have the number greater than the number of holes 46, is poured onto mold 44. Mold 44 is then vibrated, so that metal pins 26 fall into holes 46, with each of the holes 46 filled with one metal pin 26. Excess metal pins 26 not in holes 46 are then removed from mold 44. The resulting structure is shown in FIG. 9A. In some embodiments, at this time, metal pins 26 may be picked up by vacuum head 30 in FIG. 3C, and the process shown in FIGS. 3C-8B may be performed. Vacuuming channels 32 in FIG. 3C have relative positions match the relative positions of metal pins 29 in FIG. 9A, so that metal pins 26 are picked up simultaneously. In alternative embodiments, rather than picking up metal pins 26 and have the process steps in FIGS. 3D through 8B performed, the processes shown in FIGS. 9B-9E are performed.

Figure 9B:
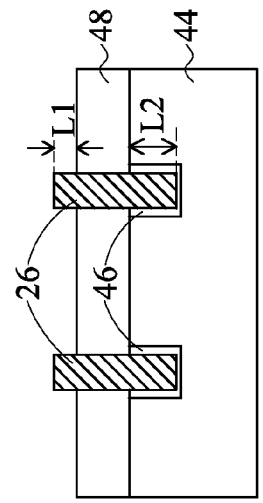

Referring to FIG. 9B, dielectric film 48 is formed, with the middle portions of metal pins 26 being embedded in dielectric film 48. The opposite ends of metal pins 26 protrude beyond dielectric film 48, for example, with the protruding portions having lengths L1 and L2 greater than about 20 μm. The top surface and the bottom surface of dielectric film 48 are substantially planar. Dielectric film 48 may be formed of a polymer or an inorganic material such as glass. In some embodiments, dielectric film 48 is a pre-made film, which is laminated on metal pins 26. A force is applied so that metal pins 26 penetrate through dielectric film 48, and hence dielectric film 48 is settled on the top surface of mold 44. In alternative embodiments, a flowable compound is dispensed on metal pins 26 and mold 44. The viscosity of the flowable compound is low enough, so that the flowable compound may flow to have a substantially planar top surface, with the top end of metal pins protruding above the top surface of the flowable compound. On the other hand, the viscosity of the flowable compound is high enough, so that it will not flow into the small gaps in holes 46, which gaps are not occupied by metal pins 26. In some embodiments, the flowable compound includes a polymer, a resin, or the like. In alternative embodiments, the flowable compound includes an inorganic material such as spin-on glass. After the curing of the flowable compound, the solidified dielectric film 48 is formed. Dielectric film 48 and the corresponding metal pins 26 may then be retrieved from mold 44.

Figure 9D:
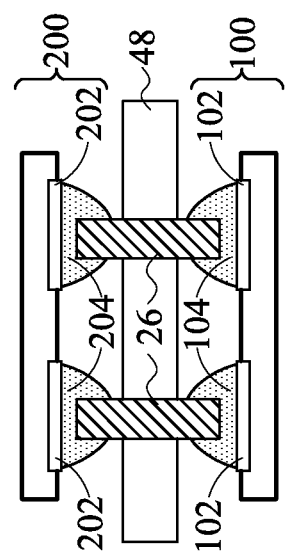
Figure 9E:
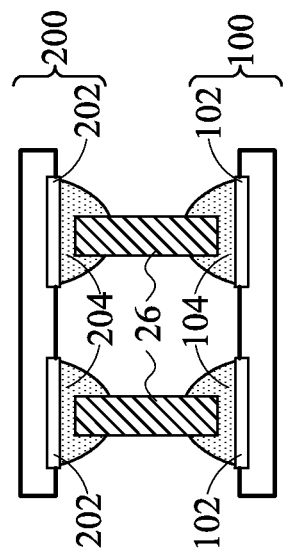
Figure 9C:
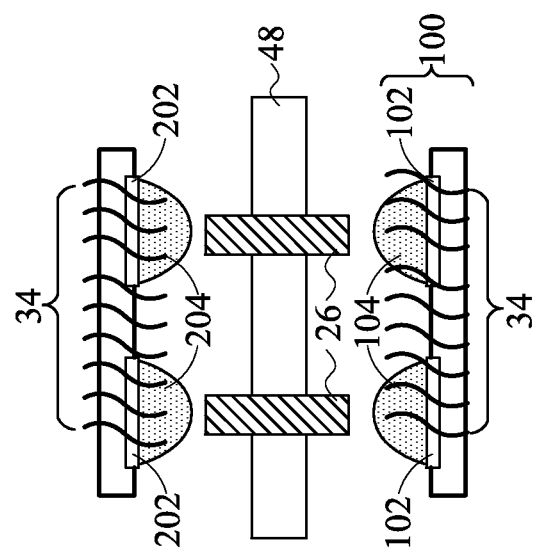

FIGS. 9C and 9D illustrate the bonding of package components 100 and 200 through metal pins 26. Referring to FIG. 9C, package component 100, metal pins 26, and package component 200 are aligned, with the respective solder regions 104 and 204 and metal pins 26 also aligned. Solder regions 104 and 204 are heated and molten simultaneously, as represented by curved lines 34. Next, as shown in FIG. 9D, metal pins 26 are inserted into molten solder regions 104 and 204. After the cooling down and the solidification of solder regions 104 and 204, package components 100 and 200 are bonded together.

In some embodiments, as shown in FIG. 9D, dielectric film 48 is left in the final package. For example, when the package in FIG. 9D is assembled in the final product and powered on, dielectric film 48 still remains. In alternative embodiments, as shown in FIG. 9E, after the step as shown in FIG. 9D is performed, dielectric film 48 is removed, for example, through a wet etching.

In FIGS. 9A through 9E, package components 100 and 200 are bonded to metal pins 26, which are attached to dielectric film 48, at the same time. In alternative embodiments, package components 100 and 200 are bonded to metal pins 26 (which are attached to dielectric film 48) sequentially.

The embodiments of the present disclosure have some advantageous features. With the using of metal pins to interconnect package components, less solder is used in the bond structures, and hence the risk of bridging of the solder regions is reduced.

In accordance with some embodiments, a package includes first package component and a second package component. The first package component includes a first electrical connector at a surface of the first package component, and a first solder region on a surface of the first electrical connector. The second package component includes a second electrical connector at a surface of the second package component, and a second solder region on a surface of the second electrical connector. A metal pin has a first end bonded to the first solder region, and a second end bonded to the second solder region.

In accordance with other embodiments, a package includes first package component and a second package component. The first package component includes a first metal pad at a surface of the first package component, and a first solder region on a surface of the first metal pad. The second package component is over and bonded to the first package component. The second package component includes a second metal pad at a surface of the second package component, and a second solder region on a surface of the second metal pad. A metal pin has a first end bonded to, and encircled by, the first solder region, and a second end bonded to, and encircled by, the second solder region. The metal pin further includes a middle portion in a space between the first solder region and the second solder region, wherein the middle portion has no solder formed thereon.

In accordance with yet other embodiments, a method heating one of a metal pin and a first solder region, wherein the first solder region is disposed at a surface of a first package component, inserting a first end of the metal pin into a first molten portion of the first solder region, and solidifying the first molten portion of the first solder region to bond the metal pin to the first solder region. The method further includes heating one of the metal pin and a second solder region, wherein the second solder region is disposed at a surface of a second package component, inserting a second end of the metal pin into a second molten portion of the second solder region, and solidifying the second molten portion of the second solder region to bond the metal pin to the second solder region. The bonding of the metal pint to the first solder region and the second solder region may be performed simultaneously.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   inserting a plurality of metal pins into a plurality of holes of a mold;
   disposing a dielectric film to allow the plurality of metal pins that is in the plurality of holes to penetrate through the dielectric film;
   heating one of a metal pin and a first solder region, wherein the first solder region is disposed at a surface of a first package component, wherein the metal pin is one of the plurality of metal pins that penetrates through the dielectric film;
   inserting a first end of the metal pin into a first molten portion of the first solder region;
   solidifying the first molten portion of the first solder region to bond the metal pin to the first solder region;
   heating one of the metal pin and a second solder region, wherein the second solder region is disposed at a surface of a second package component;
   inserting a second end of the metal pin into a second molten portion of the second solder region; and
   solidifying the second molten portion of the second solder region to bond the metal pin to the second solder region.

2. The method of claim 1, wherein the heating one of the metal pin and the first solder region comprises heating the metal pin.

3. The method of claim 1, wherein the inserting the first end of the metal pin into the first molten portion of the first solder region and the inserting the second end of the metal pin into the second molten portion of the second solder region are performed simultaneously.

4. The method of claim 1, wherein the inserting the plurality of metal pins comprises:
   pouring an additional plurality of metal pins comprising the plurality of metal pins over the mold, wherein the mold comprises a plurality of holes; and
   vibrating the mold and the additional plurality of metal pins, wherein the plurality of metal pins is vibrated into the plurality of holes.

5. The method of claim 4, wherein the dielectric film remains after the metal pin is bonded to the first solder region and the second solder region.

6. The method of claim 4 further comprising, after the solidifying the first molten portion of the first solder region and solidifying the second molten portion of the second solder region, removing the dielectric film.

7. A method comprising:
   forcing a plurality of metal pins to penetrate through a dielectric film, with both ends of each of the plurality of metal pins exposed, wherein the plurality of metal pins is formed of a non-solder metallic material;
   aligning the plurality of metal pins to have first ends of the plurality of metal pins to be coplanar with each other, and second ends of the plurality of metal pins to be coplanar with each other;
   aligning the plurality of metal pins to a first plurality of solder regions in a first package component, and a second plurality of solder regions in a second package component;
   melting the first plurality of solder regions and the second plurality of solder regions;
   inserting the plurality of metal pins into the first plurality of solder regions and the second plurality of solder regions; and
   solidifying the first plurality of solder regions and the second plurality of solder regions to bond the first plurality of solder regions and the second plurality of solder regions to the plurality of metal pins.

8. The method of claim 7, wherein the first plurality of solder regions and the second plurality of solder regions are solidified simultaneously.

9. The method of claim 7, wherein during the forcing a plurality of metal pins to penetrate through the dielectric film, the plurality of metal pins is not molten.

10. The method of claim 7, wherein the aligning the plurality of metal pins comprises placing the plurality of metal pins into a plurality of holes in a mold.

11. The method of claim 10, wherein the placing the plurality of metal pins into the plurality of holes comprises:
pouring the plurality of metal pins over the mold; and
setting the plurality of metal pins in the plurality of holes by vibrating the mold and the plurality of metal pins.

12. The method of claim 7, wherein after the first plurality of solder regions is solidified, one of the plurality of metal pins is spaced apart from a metal pad of the first package component by a solder region therebetween.

13. The method of claim 7, wherein after the first plurality of solder regions is solidified, one of the plurality of metal pins is physical disconnected from all metal pads of the first package component.

14. A method comprising:
placing a plurality of metal pins, with each of the plurality of metal pins having a first end portion in one of a plurality of holes of a mold, and a second end portion protruding out of the mold;
inserting the plurality of metal pins into a dielectric film, with a middle portion of each of the plurality of metal pins in the dielectric film, and the first end portion and the second end portion of each of the plurality of metal pins on opposite side of the dielectric film; and
bonding the first end portions of the plurality of metal pins to a first plurality of solder regions in a first package component, and the second end portions of the plurality of metal pins to a second plurality of solder regions in a second package component.

15. The method of claim 14, wherein the inserting the plurality of metal pins into a dielectric film comprises:
dispensing a flowable compound; and
curing the flowable compound into the dielectric film.

16. The method of claim 14, wherein the inserting the plurality of metal pins into the dielectric film comprises:
pre-forming the dielectric film; and
penetrating the plurality of metal pins into the pre-formed dielectric film.

17. The method of claim 14 further comprising, after the bonding, removing the dielectric film.

18. The method of claim 14, wherein the first end portion and the second end portion of each of the plurality of metal pins have substantially a same width.

19. The method of claim 1, wherein the disposing the dielectric film comprises forcing the dielectric film against the plurality of metal pins in the plurality of holes to allow the plurality of metal pins to penetrate through the dielectric film.

20. The method of claim 1, wherein the disposing the dielectric film comprises dispensing a flowable compound to encircle middle portions of the plurality of metal pins that is in the plurality of holes; and
curing the flowable compound to form the dielectric film.

* * * * *